(12) United States Patent
Tanaka et al.

(10) Patent No.: US 11,013,160 B2
(45) Date of Patent: May 18, 2021

(54) COMPONENT MOUNTING METHOD AND METHOD FOR MANUFACTURING COMPONENT-MOUNTED BOARD

(71) Applicant: Panasonic Intellectual Property Management Co., Ltd., Osaka (JP)

(72) Inventors: Tetsuya Tanaka, Fukuoka (JP); Masahiko Akasaka, Fukuoka (JP); Koji Sakurai, Fukuoka (JP); Toshihiko Nagaya, Fukuoka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 247 days.

(21) Appl. No.: 16/123,122

(22) Filed: Sep. 6, 2018

(65) Prior Publication Data
US 2019/0090393 A1    Mar. 21, 2019

(30) Foreign Application Priority Data

Sep. 19, 2017    (JP) .............................. JP2017-178542

(51) Int. Cl.
| | |
|---|---|
| H05K 3/30 | (2006.01) |
| H05K 13/04 | (2006.01) |
| H05K 3/34 | (2006.01) |
| H05K 3/32 | (2006.01) |
| H05K 3/12 | (2006.01) |

(52) U.S. Cl.
CPC ........... *H05K 13/0465* (2013.01); *H05K 3/12* (2013.01); *H05K 3/306* (2013.01); *H05K 3/321* (2013.01); *H05K 3/341* (2013.01); *H05K 3/3447* (2013.01); *H05K 13/0469* (2013.01); *H05K 3/1216* (2013.01); *H05K 3/303* (2013.01); *H05K 3/3485* (2020.08); *Y10T 29/49139* (2015.01)

(58) Field of Classification Search
USPC ......... 29/837, 739, 740, 741, 830, 832, 840, 29/845
See application file for complete search history.

(56) References Cited

U.S. PATENT DOCUMENTS

| | | | | |
|---|---|---|---|---|
| 6,849,805 | B2 * | 2/2005 | Honda | ................ H05K 3/3447 174/250 |
| 9,730,334 | B2 * | 8/2017 | Bekke | ................ H05K 3/3415 |

FOREIGN PATENT DOCUMENTS

JP    2016-025220 A    2/2016

* cited by examiner

*Primary Examiner* — Thiem D Phan
(74) *Attorney, Agent, or Firm* — Pearne & Gordon LLP

(57) ABSTRACT

There is provided a component mounting method for mounting an electronic component provided with a connecting pin on a board having a through-hole, including inserting the pin of the electronic component into an inner hole filled with solder paste at a first electrode provided in the through-hole to execute a component mounting operation of lowering the pin to a predetermined mounting height position and pulling up the pin once inserted and lowered into the inner hole in the component mounting operation to a preset intermediate height position.

16 Claims, 8 Drawing Sheets

COMPONENT MOUNTING METHOD AND METHOD FOR MANUFACTURING COMPONENT-MOUNTED BOARD

BACKGROUND

1. Technical Field

The present disclosure relates to a component mounting method for mounting an electronic component on a board having a through-hole and a method for manufacturing a component-mounted board.

2. Description of the Related Art

In a case where a target component as a mounting form of an electronic component is mounted on a board via a pin as a connecting terminal such as a connector, a so-called through-hole electrode is provided on the board, in which an electrode for inserting a pin and solder-bonding penetrates the board. In the component mounting targeting such a through-hole electrode, after solder paste is supplied to the through-hole electrode by screen printing, a pin is inserted into the through-hole electrode and solder-bonded (for example, see Japanese Patent Unexamined Publication No. 2016-25220).

In Japanese Patent Unexamined Publication No. 2016-25220, a part of the solder paste filled in the through-hole electrode is pushed out by the inserted pin. At this time, the pushed-out solder paste adheres to the tip of the pin and may be separated from the solder paste in the through-hole electrode in some cases. Even in such a case, if the solder paste is melted by reflow, the solder paste adhering to the tip of the inserted pin gets wet up along the pin and is integrated with the solder in the through-hole electrode to form a solder-bonded portion.

In recent years, the application of mounting boards on which electronic components are mounted and the quality requirements required for these mounting boards have been diversified. Among these mounting boards, those used for in-vehicle electronic devices are required to have high reliability. In a case where this type of mounting board includes the above-mentioned through-hole electrode, it is important to increase the bonding reliability of the solder-bonded portion for joining the pin inserted in the through-hole electrode. Solder supplied for solder-bonding is supplied in the form of solder paste, but since the volume of solder paste is about half when melted, it is necessary to supply a sufficient amount of solder paste to the through-hole electrode in order to improve the bonding reliability. Specifically, it is not sufficient to fill the inside of the through-hole electrode with a required supply amount, and it is desirable to fill the solder paste in a form that the solder paste protrudes from the lower end of the through-hole electrode.

Accordingly, an object of the present disclosure is to provide a component mounting method and a method for manufacturing a component-mounted board capable of stably mounting an electronic component on a board having a through-hole electrode with high reliability.

SUMMARY

According to an aspect of the present disclosure, there is provided a component mounting method for mounting an electronic component provided with a connecting pin on a board having a through-hole, including inserting the pin of the electronic component into an inner hole filled with solder paste at a first electrode provided in the through-hole to execute a component mounting operation of lowering the pin to a predetermined mounting height position. The pin once inserted and lowered into the inner hole in the component mounting operation is pulled up to a preset height position.

According to another aspect of the present disclosure, there is provided a component mounting method for mounting an electronic component provided with a connecting pin on a board having a through-hole. The component mounting method includes a printing step of printing solder paste on a board, a mounting step of mounting an electronic component on board on which solder is printed, and a reflow step of melting and solidifying solder in solder paste by heating board on which the electronic component is mounted and solder-bonding the electronic component to board. In the mounting step, the pin of the electronic component is inserted into an inner hole filled with solder paste at the first electrode provided in the through-hole to execute a component mounting operation of lowering the pin to the predetermined mounting height position. The pin once inserted and lowered into the inner hole in the component mounting operation is pulled up to the preset intermediate height position, and in the reflow step, the board on which the component mounting operation has been completed is reflowed, whereby the pin is solder-bonded to the first electrode.

According to still another aspect of the present disclosure, there is provided a method for manufacturing a component-mounted board by mounting an electronic component provided with a connecting pin on a board having a through-hole. The pin of the electronic component is inserted into an inner hole filled with solder paste at a first electrode provided in the through-hole to execute a component mounting operation of lowering the pin to the predetermined mounting height position and pulling up the pin once inserted and lowered into the inner hole in the component mounting operation to the preset intermediate height position.

According to still another aspect of the present disclosure, there is provided a method for manufacturing a component-mounted board by mounting an electronic component provided with a connecting pin on a board having a through-hole. The component mounting method includes a printing step of printing solder paste on a board, a mounting step of mounting an electronic component on board on which solder paste is printed, and a reflow step of melting and solidifying solder in solder paste by heating board on which the electronic component is mounted and solder-bonding the electronic component to board. In the mounting step, the pin of the electronic component is inserted into an inner hole filled with solder paste at a first electrode provided in the through-hole to execute a component mounting operation of lowering the pin to the predetermined mounting height position and pulling up the pin once inserted and lowered into the inner hole in the component mounting operation to the preset intermediate height position. In the reflow step, the pin is solder-bonded to a first electrode by reflowing the board on which the component mounting operation has been completed.

According to the present disclosure, it is possible to stably mount an electronic component on a board having a through-hole electrode with high reliability.

DETAILED DESCRIPTION

Prior to describing the embodiment of the present disclosure, problems in the device of the related art will be briefly described.

Solder paste in a through-hole electrode is pushed out by a pin and is separated into solder paste in the through-hole electrode and solder paste adhering to a tip of the pin. At this time, in a case where a lot of solder paste is filled in such a form as to protrude from the lower end of the through-hole electrode in order to enhance the reliability of solder bonding, the amount of solder paste adhering to the tip of the pin increases, and the solder paste sometimes falls during reflow. In addition, if the amount of solder paste adhered to the tip of the pin is large, the solder may get wet and not rise, and the solder may be hardened while remaining adhered to the pin. In such a case, the amount of solder at a solder-bonded portion is insufficient and it is difficult to increase the bonding reliability. As described above, there was a problem that it is difficult to stably mount an electronic component on a board having a through-hole electrode with high reliability which is required for an on-vehicle electronic device or the like.

Figure 1:
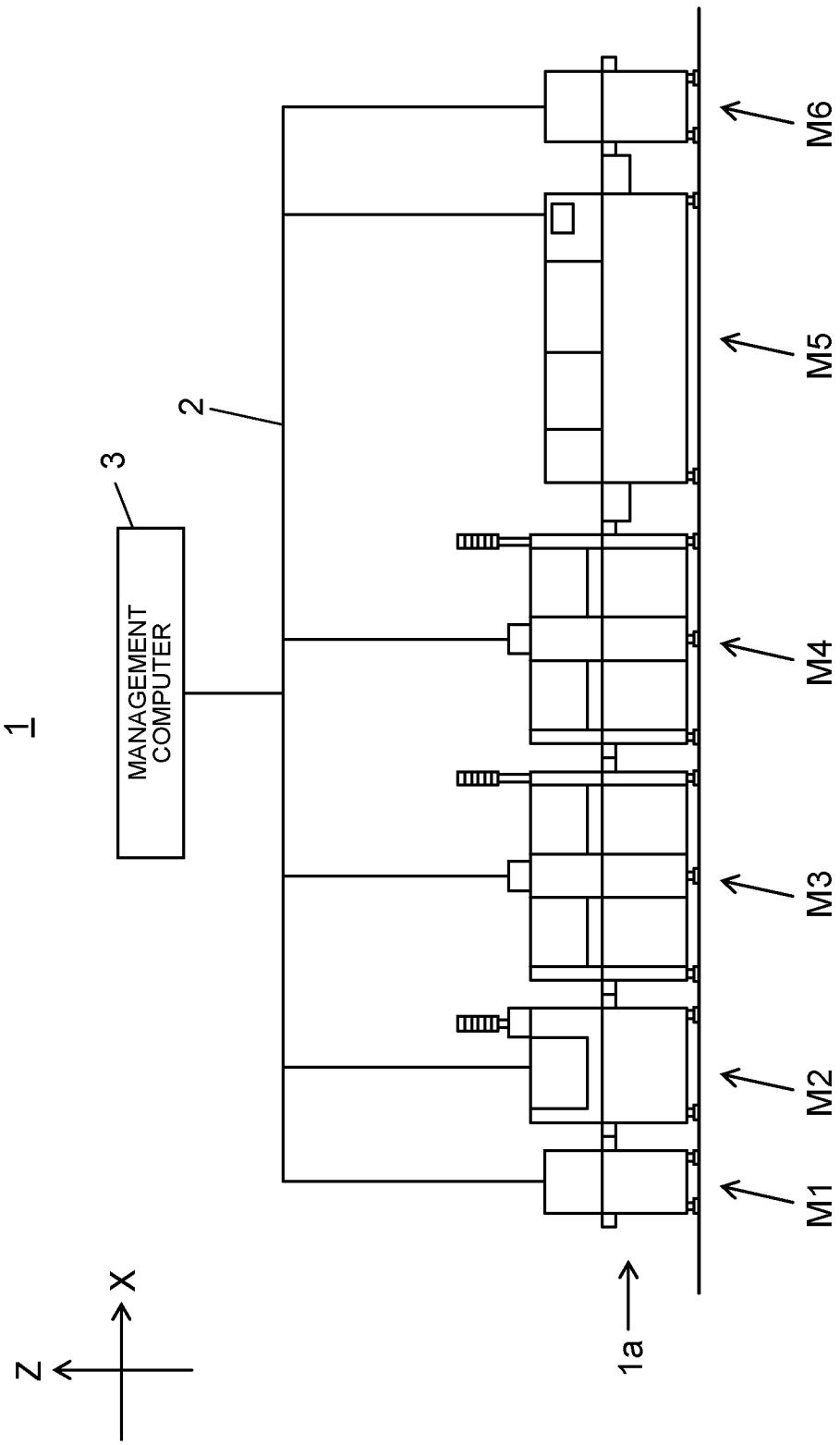
FIG. 1 is a configuration explanatory diagram of a component mounting system according to an embodiment of the present disclosure.

Next, the embodiment of the present disclosure will be described with reference to drawings. First, the configuration of component mounting system 1 will be described with reference to FIG. 1. Component mounting system 1 has a function of mounting an electronic component on a board to manufacture a component-mounted board. In the present embodiment, an electronic component provided with a connecting pin is mounted on a board having a through-hole to manufacture a component-mounted board.

Component mounting system 1 is mainly composed of component mounting line 1a configured by connecting board supply device M1, screen printing device M2, first component mounting device M3, second component mounting device M4, reflow device M5, and board collecting device M6 in series in a board transfer direction (X direction). The respective devices of board supply device M1 to board collecting device M6 are connected to management computer 3 via communication network 2.

Each of these devices is connected by a board transfer mechanism, and board 4 (see FIGS. 2, 3A, and 3B) supplied by board supply device M1 sequentially receives component mounting line 1a from the upstream side to the downstream side. That is, board 4 is first carried into screen printing device M2. Here, by moving a squeegee on a screen mask, solder paste for component bonding is printed on board 4 provided with a through-hole.

Board 4 on which the solder paste is printed is successively delivered to first component mounting device M3 and second component mounting device M4, and a component mounting operation of mounting an electronic component on board 4 on which the solder paste is printed is executed. In the present embodiment, the electronic component to be mounted includes surface-mount component 5 such as a chip component, and pin connection component 6 provided with connecting pin 6a such as a connection component (FIGS. 3A, 3B, and 7A to 7D). First, surface-mount component 5 is mounted by first component mounting device M3, and then pin connection component 6 is mounted by second component mounting device M4.

Board 4 on which these electronic components are mounted is carried into reflow device M5, and reflow is performed collectively here. That is, by heating board 4 according to a predetermined heating profile, the solder ingredient in the solder paste is melted and solidified. In this way, surface-mount component 5 and pin connection component 6 are collectively solder-bonded to board 4, and a component-mounted board on which these electronic components are mounted is completed on board 4. The completed component-mounted board is collected by board collecting device M6.

Figure 2:
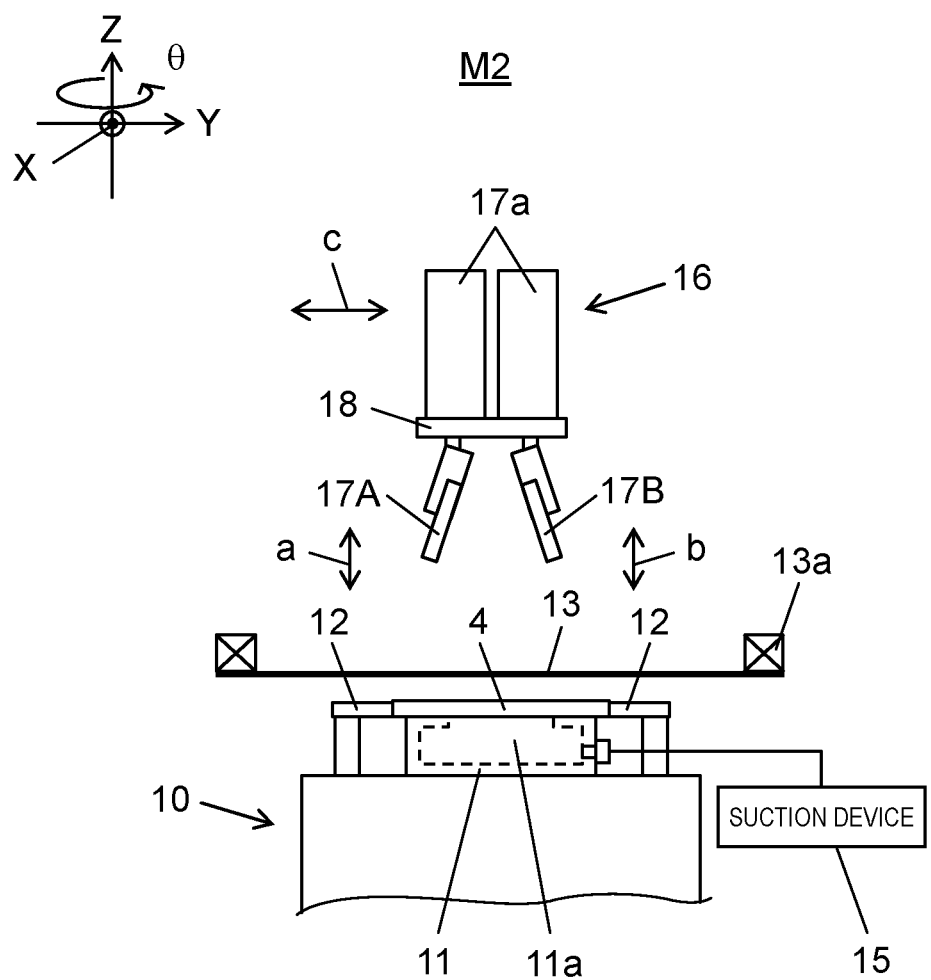
FIG. 2 is a functional explanatory diagram of a screen printing device in the component mounting system according to the embodiment of the present disclosure.

Next, the function of screen printing device M2 will be described with reference to FIG. 2. In FIG. 2, screen printing device M2 is provided with board positioner 10 for holding and positioning carried board 4. Board positioner 10 has a positioning table movable in the X direction, a Y direction, a Z direction, and a θ direction which is the rotation direction around the Z axis. On the upper surface of board positioner 10, there is provided board underpropper 11 that props and supports board 4 from the lower surface. Board 4 propped by board underpropper 11 is clamped from both sides by clamp mechanism 12 and the position thereof is fixed.

Suction space 11a having an open upper surface is formed inside board underpropper 11. In addition, board underpropper 11 is connected to suction device 15. By operating suction device 15, the air in suction space 11a is sucked. Here, board 4 is disposed so as to cover the upper surface of board underpropper 11. In this way, suction device 15 may suck the air in suction space 11a from the lower surface side of board 4 propped by board underpropper 11. In the present embodiment, suction is performed from the lower surface side of board 4 in the step of screen printing so that filling of solder paste 9 into inner hole 8b of through-hole electrode 8 formed on board 4 is accelerated (see FIGS. 5A to 5C).

Above board positioner 10, screen mask 13 extended to mask holder 13a is disposed. In screen mask 13, first pattern hole 14b and second pattern hole 14a are formed (see FIG. 4A). First pattern hole 14b and second pattern hole 14a correspond to through-hole electrode 8 (the first electrode) and surface-mount electrode 7 (the second electrode) provided respectively corresponding to pin connection component 6 and surface-mount component 5 in board 4 to be printed. Board 4 is brought into contact with the lower surface of screen mask 13 by raising board positioner 10 in a state in which board 4 is propped by board underpropper 11.

Above screen mask 13, squeegee unit 16 having squeegees 17A and 17B is disposed. Squeegee unit 16 includes squeegee elevating mechanism 17a provided on the upper surface of moving plate 18 so as to correspond to each of squeegees 17A and 17B. By driving squeegee elevating mechanism 17a, squeegees 17A and 17B individually move up and down (arrows a and b). Further, moving plate 18 may reciprocate (arrow c) in a squeezing operation direction (Y direction) by a squeegee moving mechanism (not shown).

In a state in which one of squeegees 17A and 17B is lowered with respect to screen mask 13, squeegees 17A and 17B fill first pattern hole 14b and second pattern hole 14a formed in screen mask 13 with solder paste 9 supplied to the upper surface of screen mask 13 by moving moving plate 18 in a squeezing operation direction. In this state, by lowering board 4 and separating the plate from the lower surface of screen mask 13, solder paste 9 filled in first pattern hole 14b and second pattern hole 14a is supplied to through-hole electrode 8 and surface-mount electrode 7 by printing.

Figure 3A:
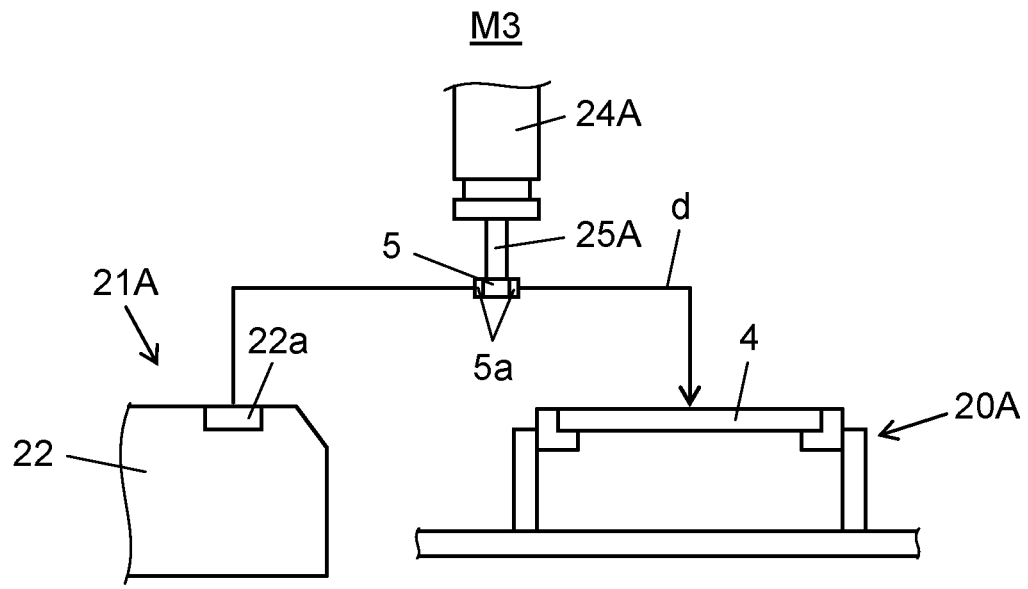
FIG. 3A is a functional explanatory diagram of a component mounting device in the component mounting system according to the embodiment of the present disclosure.

Next, the functions of first component mounting device M3 and second component mounting device M4 will be described with reference to FIGS. 3A and 3B. As shown in FIG. 3A, first component mounting device M3 is provided with board transporter 20A that transports and positions board 4 and component supplier 21A that supplies components to be mounted. Tape feeder 22 that supplies surface-mount component 5 such as a chip component in a state of being accommodated with tape at component unloading position 22a by tape feeding is disposed in component supplier portion 21A. Surface-mount component 5 is a chip-type component in which connecting terminals 5a are formed at both end portions.

Surface-mount component 5 supplied at component unloading position 22a is held by component holding tool 25A attached to mounting head 24A and unloaded from tape feeder 22. Then, by moving mounting head 24A holding surface-mount component 5 above board 4 to perform the component mounting operation on a component mounting position (arrow d), surface-mount component 5 is mounted on the component mounting position for a surface-mount component set on board 4 (see FIG. 7A).

Figure 3B:
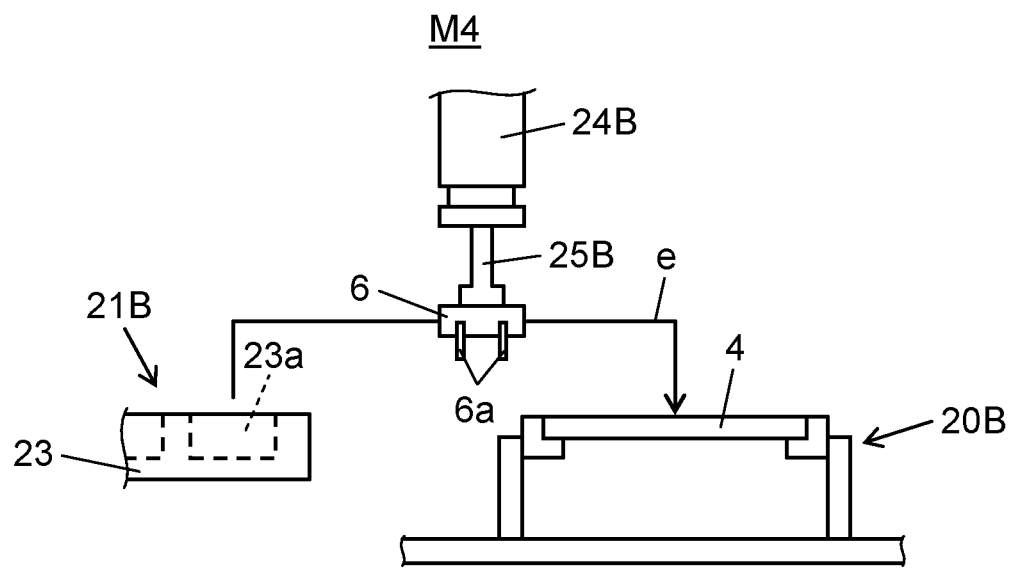
FIG. 3B is a functional explanatory diagram of the component mounting device in the component mounting system according to the embodiment of the present disclosure.

As shown in FIG. 3B, second component mounting device M4 is provided with board transporter 20B that transports and positions board 4 and component supplier 21B that supplies components to be mounted. In component supplier 21B, component tray 23 for accommodating pin connection component 6 is held and disposed by a tray feeder (not shown). In component tray 23, accommodation concave portion 23a for accommodating pin connection component 6 is formed in an ordered arrangement. Pin connection component 6 is a connector component in which a plurality of connecting pins 6a are formed on the lower surface.

Pin connection component 6 accommodated in accommodation concave portion 23a is held by component holding tool 25B attached to mounting head 24B and unloaded from component tray 23. Then, by moving mounting head 24B holding pin connection component 6 above board 4 to perform the component mounting operation on the component mounting position (arrow e), pin connection component 6 is mounted on the component mounting position for a connector component set on board 4. At this time, a pin inserting operation of inserting pin 6a into inner hole 8b of through-hole electrode 8 provided on board 4 is executed (see FIG. 7B).

In second component mounting device M4, in the elevation drive mechanism that raises and lowers mounting head 24B, a function of setting a lowering speed, an acceleration, and a lowering distance in the lowering operation of lowering pin connection component 6 with respect to board 4 and inserting pin 6a into inner hole 8b is provided. In addition to this, in the elevation drive mechanism of raising and lowering mounting head 24B, a function of setting a raising speed, an acceleration, and a raising distance in the raising operation of pulling up pin 6a inserted in inner hole 8b is provided. In this way, in the component mounting operation of mounting pin connection component 6 on board 4, it is possible to perform a pin vertical movement for repeatedly raising and lowering pin 6a inserted in inner hole 8b.

Next, a method for manufacturing a component-mounted board to be executed by component mounting system 1 having the above-described configuration will be described with reference to FIGS. 4A to 8C. In the method for manufacturing this component-mounted board, by moving the squeegee on the screen mask, the solder paste is printed on the board provided with the through-hole. Further, in the method for manufacturing this component-mounted board, an electronic component provided with a connecting pin is mounted on a board having a through-hole electrode provided in a through-hole to manufacture a component-mounted board.

Specifically, the method for manufacturing a component-mounted board described above has a process configuration including a printing step of printing solder paste 9 on board 4, a mounting step of mounting an electronic component on board 4 on which solder paste 9 is printed, and a reflow step of melting and solidifying solder in solder paste 9 by heating board 4 on which the electronic component is mounted and solder-bonding the electronic component to board 4.

First, a printing step in the method for manufacturing a component-mounted board described above, that is, a screen printing method for printing a solder paste on a board provided with a through-hole by moving a squeegee on a screen mask will be described with reference to FIGS. 4A to 4C, 5A to 5C, and 6A to 6C.

Figure 4A:
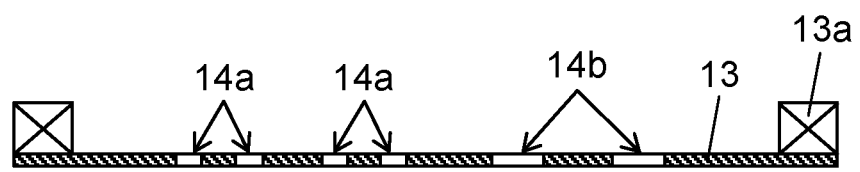
FIG. 4A is a process explanatory diagram showing a method for manufacturing a component-mounted board according to the embodiment of the present disclosure.
Figure 4B:
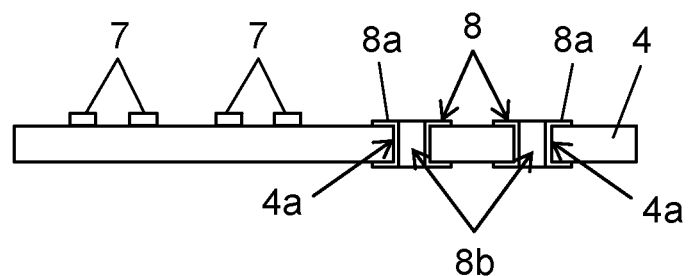
FIG. 4B is a process explanatory diagram showing a method for manufacturing the component-mounted board according to the embodiment of the present disclosure.

FIG. 4A shows screen mask 13 mounted on screen printing device M2 shown in FIG. 2. The periphery of screen mask 13 is held by mask holder 13a, and first pattern hole 14b and second pattern hole 14a are formed in screen mask 13. First pattern hole 14b and second pattern hole 14a correspond to through-hole electrode 8 and surface-mount electrode 7 formed on board 4 shown in FIG. 4B, respectively.

Through-hole electrode 8 is the first electrode provided in through-hole 4a formed through board 4. Surface-mount electrode 7 is a second electrode for a surface mount component such as a chip component. Through-hole electrode 8 is provided with land portion 8a covering a predetermined range of the periphery of through-hole 4a on the upper surface of board 4, and inner hole 8b penetrating vertically through through-hole 4a.

Figure 4C:
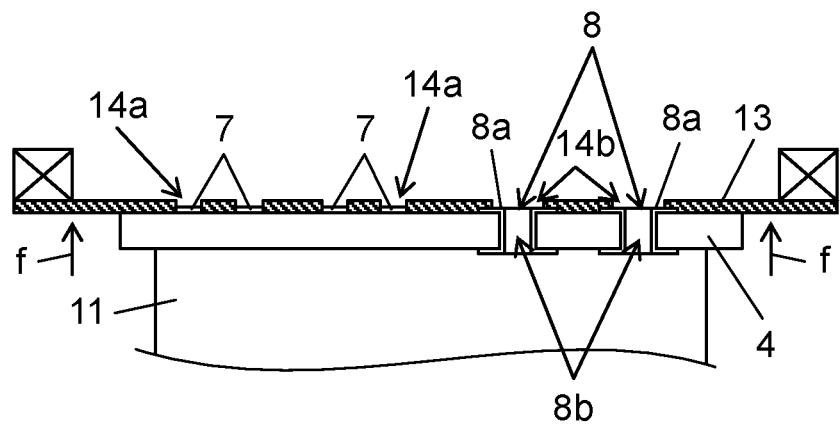
FIG. 4C is a process explanatory diagram showing a method for manufacturing the component-mounted board according to the embodiment of the present disclosure.

During the screen printing, first, as shown in FIG. 4C, board 4 having the lower surface propped by board underpropper 11 is raised with respect to screen mask 13 (arrow f), and board 4 is brought into contact with screen mask 13 provided with first pattern hole 14b and second pattern hole 14a from the lower surface side. In this way, land portion 8a and inner hole 8b of through-hole electrode 8 are aligned with first pattern hole 14b, and surface-mount electrode 7 is aligned with second pattern hole 14a.

Here, the area of first pattern hole 14b corresponding to through-hole electrode 8 is set so as to be larger than the area of inner hole 8b of through-hole electrode 8. In this way, it is possible to reliably fill solder paste 9 pressed from first pattern hole 14b into inner hole 8b in the following printing operation.

Figure 5A:
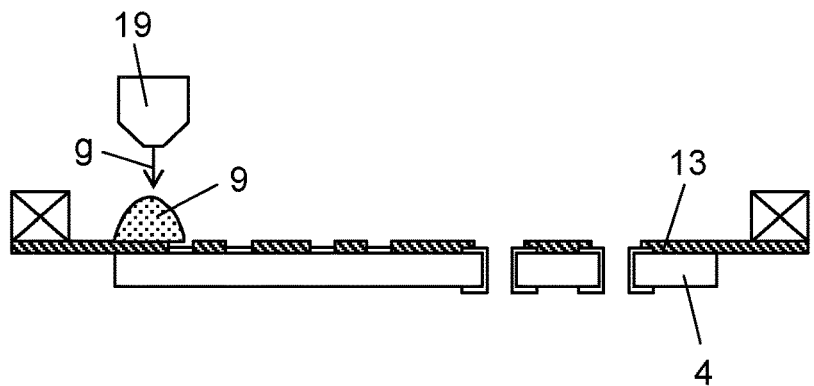
FIG. 5A is a process explanatory diagram showing a method for manufacturing the component-mounted board according to the embodiment of the present disclosure.
Figure 5B:
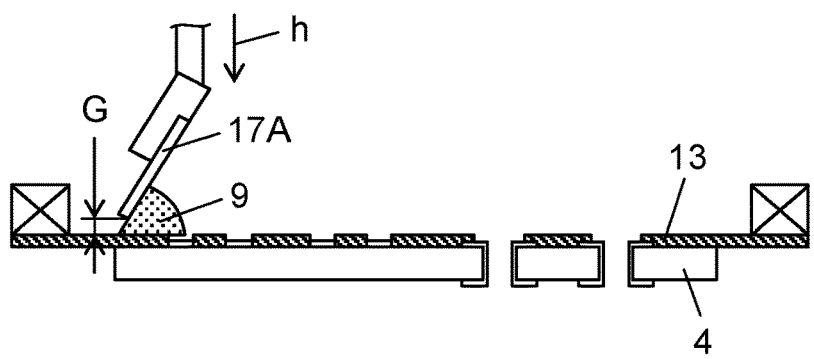
FIG. 5B is a process explanatory diagram showing a method for manufacturing the component-mounted board according to the embodiment of the present disclosure.

Next, as shown in FIG. 5A, solder paste 9 is ejected by print head 19 positioned at the end portion of board 4 above screen mask 13, and solder paste 9 is supplied onto screen mask 13. Thereafter, as shown in FIG. 5B, squeegee 17A is lowered to a position where predetermined gap G is formed between the lower end portion and the upper surface of screen mask 13, and forward pass printing by squeegee 17A is executed.

Figure 5C:
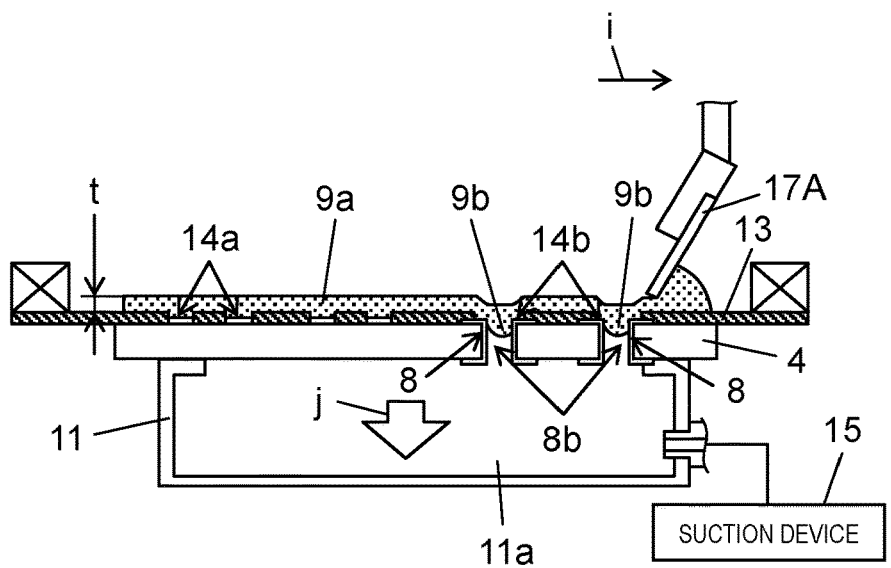
FIG. 5C is a process explanatory diagram showing a method for manufacturing the component-mounted board according to the embodiment of the present disclosure.

In this state, as shown in FIG. 5C, squeegee 17A is moved in a first direction (the direction of arrow i) which is a forward direction. In this way, on the upper surface of screen mask 13, paste layer 9a in which solder paste 9 is spread is formed with thickness t corresponding to predetermined gap G. Along with this, solder paste 9 is pushed into second pattern hole 14a and first pattern hole 14b. In this way, a layer of solder paste 9 is formed on the upper surface of through-hole electrode 8 which is the first electrode in first pattern hole 14b. That is, in the forward pass printing described above, squeegee 17A is positioned above screen mask 13 with predetermined gap G therebetween and squeegee 17A is moved in a first direction to form a layer of solder paste 9 on the upper surface of through-hole electrode 8 via first pattern hole 14b.

During the forward pass printing in which squeegee 17A is moved in the first direction to form a layer of solder paste 9 on the upper surface of through-hole electrode 8, suction device 15 is actuated to suck air in suction space 11a and suction is performed from the lower surface of board 4 (arrow j). In this way, the inside of inner hole 8b is sucked from the lower surface side and solder paste 9 positioned on the upper surface of through-hole electrode 8 is drawn into inner hole 8b to become paste-drawn portion 9b. At this time, in the portion of paste layer 9a positioned above through-hole electrode 8, a recessed portion whose surface is recessed by paste-drawn portion 9b being drawn into inner hole 8b is formed.

Figure 6A:
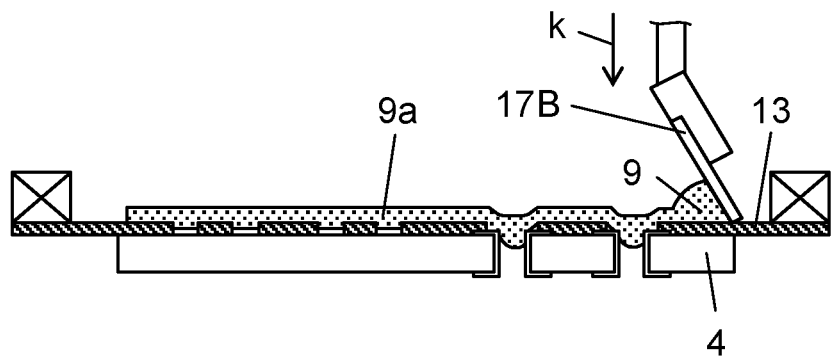
FIG. 6A is a process explanatory diagram showing a method for manufacturing the component-mounted board according to the embodiment of the present disclosure.
Figure 6B:
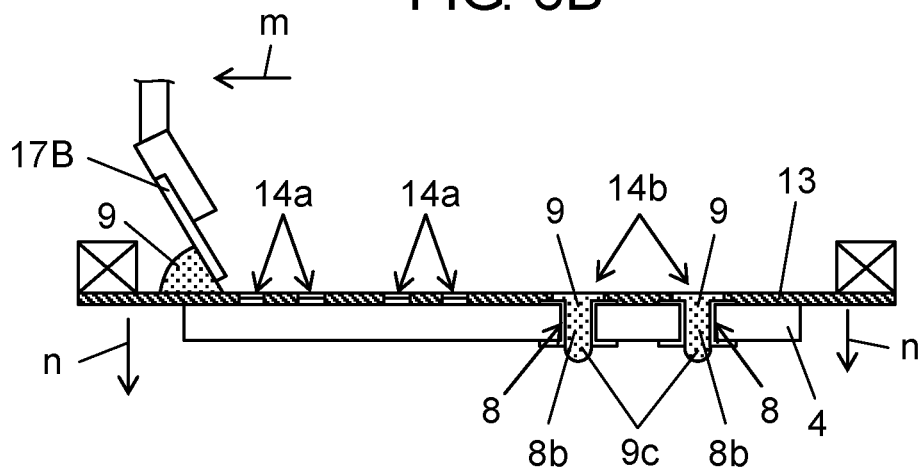
FIG. 6B is a process explanatory diagram showing a method for manufacturing the component-mounted board according to the embodiment of the present disclosure.

Next, backward pass printing by squeegee 17B is executed. That is, after raising squeegee 17A that has completed the forward pass printing, as shown in FIG. 6A, squeegee 17B is lowered (arrow k) and the lower end portion is brought into contact with the upper surface of screen mask 13. In this state, as shown in FIG. 6B, squeegee 17B is moved in the backward direction, which is a second direction different from the first direction (arrow m).

In this way, paste layer 9a formed on the upper surface of screen mask 13 in the forward pass printing is scraped off by the movement of squeegee 17B. At the same time, solder paste 9 is pushed into first pattern hole 14b by the squeegeeing movement in which squeegee 17B moves, and solder paste 9 is filled in inner hole 8b of through-hole electrode 8. In this backward pass printing, when operating in the second direction, squeegee 17B prints solder paste 9 on surface-mount electrode 7 which is the second electrode via second pattern hole 14a.

At this time, since paste-drawn portion 9b drawn in by forward pass printing already exists in inner hole 8b of through-hole electrode 8, as solder paste 9 is newly pushed in by backward pass printing, the inside of inner hole 8b is filled with solder paste 9. At this time, a sufficient amount of solder paste 9 is pushed into inner hole 8b via first pattern hole 14b, whereby paste protruding portion 9c protruding from the lower surface of board 4 is formed at the lower end portion of inner hole 8b. That is, in the above-described backward pass printing, squeegee 17B is brought into contact with screen mask 13 and squeegee 17B is moved in the second direction (direction of arrow m) which is different from the first direction to fill inner hole 8b of through-hole electrode 8 with solder paste 9 while pushing the layer of solder paste 9 so that solder paste 9 protrudes from the lower surface of board 4.

Figure 6C:
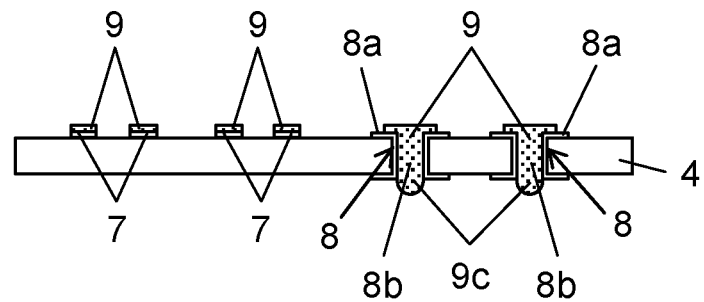
FIG. 6C is a process explanatory diagram showing a method for manufacturing the component-mounted board according to the embodiment of the present disclosure.

Thereafter, plate separation is performed. That is, by lowering board underpropper 11 which has propped board 4, board 4 is separated from the lower surface of screen mask 13 (arrow n). In this way, as shown in FIG. 6C, solder paste 9 for solder-bonding is supplied to board 4 by screen printing. In board 4 after the screen printing, solder paste 9 is supplied to the upper surface of surface-mount electrode 7 with a film thickness corresponding to the thickness of screen mask 13, and solder paste 9 is supplied to through-hole electrode 8 in such a form as to cover the upper surface of land portion 8a and filling inner hole 8b. Further, on the lower end portion of inner hole 8b, paste protruding portion 9c in which solder paste 9 protrudes downward from the lower surface of board 4 is formed.

Next, a mounting step in the method for manufacturing a component-mounted board described above, that is, a component mounting method for mounting pin connection component 6 provided with connecting pin 6a on board 4 having through-hole electrode 8 provided in a through-hole 4a will be described with reference to FIGS. 7A to 7D and FIGS. 8A to 8C. Here, the operation to be described below is executed on board 4 on which solder paste 9 is printed by screen printing device M2 in the state shown in FIG. 6C. The embodiment shown here includes an example in which surface-mount component 5 is included as a mounting target together with pin connection component 6 provided with connecting pin 6a.

Figure 7A:
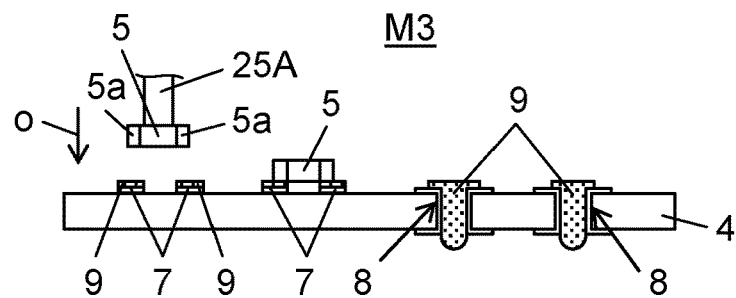
FIG. 7A is a process explanatory diagram showing a method for manufacturing the component-mounted board according to the embodiment of the present disclosure.

Board 4 is first carried into first component mounting device M3 (see FIG. 3A), and mounting of surface-mount component 5 on board 4 is executed as shown in FIG. 7A. Here, surface-mount component 5 is held by component holding tool 25A attached to mounting head 24 A, and surface-mount component 5 is aligned with surface-mount electrode 7 formed on the upper surface of board 4. That is, terminals 5a at both ends of surface-mount component 5 are aligned with solder paste 9 supplied to surface-mount electrodes 7, and surface-mount component 5 is lowered (arrow o), and terminals 5a are landed on solder paste 9.

Figure 7B:
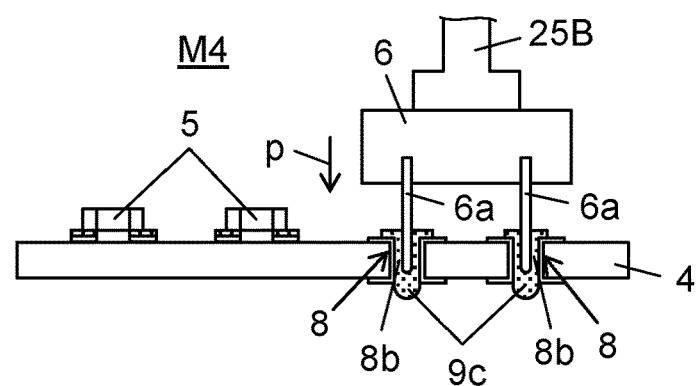
FIG. 7B is a process explanatory diagram showing a method for manufacturing the component-mounted board according to the embodiment of the present disclosure.

Subsequently, board 4 is carried into second component mounting device M4 (see FIG. 3B), and as shown in FIG. 7B, pin connection component 6 provided with connecting pin 6a is mounted on board 4 having through-hole 4a. Here, pin connection component 6 is held by component holding tool 25B attached to mounting head 24B. Subsequently, pin connection component 6 is aligned with through-hole electrode 8 formed on board 4 and lowered (arrow p), and pin 6a is inserted into inner hole 8b of through-hole electrode 8. Thereafter, after executing the pin vertical movement described below, finally, by lowering pin 6a to a predetermined mounting height position (see the height position of pin 6a shown in FIG. 8A), the component mounting operation targeting pin connection component 6 is completed.

That is, in the mounting step shown in FIGS. 7A to 7D and 8A described above, the component mounting operation of inserting pin 6a of pin connection component 6 into inner hole 8b filled with solder paste 9 in through-hole electrode 8 provided in through-hole 4a and lowering pin 6a to the predetermined mounting height position is executed. In this component mounting operation, the pin vertical movement is performed to pull up pin 6a once inserted into inner hole 8b and lowered to a preset intermediate height position.

Here, the pin vertical movement will be described. As shown in the present embodiment, in the pin inserting operation of inserting pin 6a into inner hole 8b filled with solder paste 9, a part of solder paste 9 in inner hole 8b is pushed out by the tip of pin 6a. In this way, solder paste 9 integrally printed on through-hole electrode 8 is in a state in which a substantially ball-shaped tip adhesion paste 9d adhered to the tip portion of pin 6a and solder paste 9 remaining in inner hole 8b are separated (see FIG. 7C).

In this way, when board 4 is sent to the next reflow step while tip adhesion paste 9d adheres to the tip portion of pin 6a, troubles of solder-bonding as described below are caused at the time of melting the solder. That is, by heating board 4, the solder ingredient of tip adhesion paste 9d at the tip portion of pin 6a is melted. At this time, depending on the size of tip adhesion paste 9d and the state of adhesion to pin 6a, there is a possibility that either the solder ingredient of tip adhesion paste 9d drops off from pin 6a and falls or solidifies at the position as it is without wetting up along pin 6a.

In either case, tip adhesion paste 9d adhered to the tip portion of pin 6a is not integrated with solder paste 9 in inner hole 8b and does not contribute to the formation of the solder-bonded portion where pin 6a is solder-bonded to through-hole electrode 8. That is, even when solder paste 9 forms paste protrusion 9c protruding downward from the lower surface of board 4 in the printing step for the purpose of forming a good solder-bonded portion for joining pin 6a to through-hole electrode 8, if tip adhesion paste 9d adhered to the tip portion of pin 6a is separated in the insertion of pin 6a in the mounting step, there is no point in forming paste protrusion 9c in the printing step.

Figure 7C:
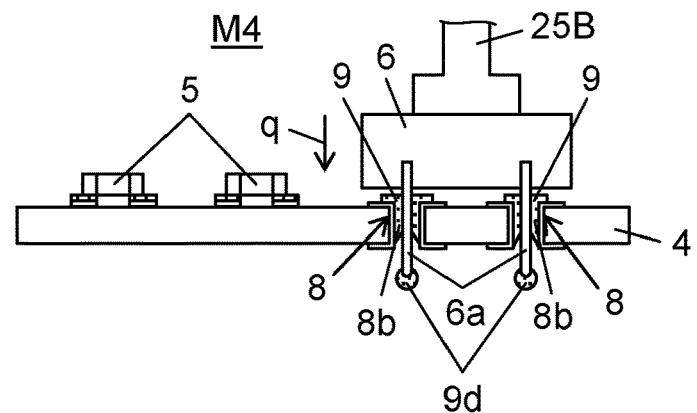
FIG. 7C is a process explanatory diagram showing a method for manufacturing the component-mounted board according to the embodiment of the present disclosure.

In order to solve such inconvenience, in the component mounting method described in this embodiment, in a state in which pin 6a is inserted in inner hole 8b of through-hole electrode 8, as shown in FIG. 7C, pin connection component 6 is further lowered (arrow q) and pin 6a is lowered until the tip portion of pin 6a reaches a position lower than the lower end portion of inner hole 8b. At this time, as described above, tip adhesion paste 9d adhered to the tip portion of pin 6a is separated from solder paste 9 filled in inner hole 8b.

Figure 7D:
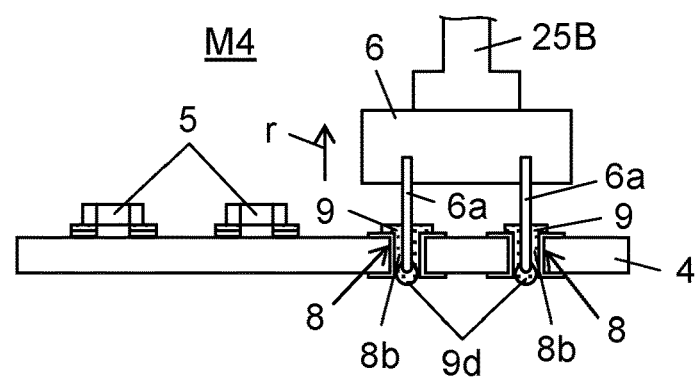
FIG. 7D is a process explanatory diagram showing a method for manufacturing the component-mounted board according to the embodiment of the present disclosure.

Next, as shown in FIG. 7D, pin connection component 6 is raised (arrow r), and pin 6a is pulled up to a height position where tip adhesion paste 9d adhered to the tip portion of pin 6a comes into contact with solder paste 9 filled in inner hole 8b. The height position of pin 6a at this time is an intermediate height position preset at a position higher than the mounting height position described above. That is, here, in a state in which pin 6a is inserted in inner hole 8b, the pin vertical movement for lowering and pulling up pin 6a is executed. By executing this pin vertical movement at least once, solder paste 9 separated into tip adhesion paste 9d adhered to the tip portion of pin 6a and tip adhesion paste 9d at the tip portion of pin 6a is integrated with solder paste 9 in inner hole 8b.

Figure 8A:
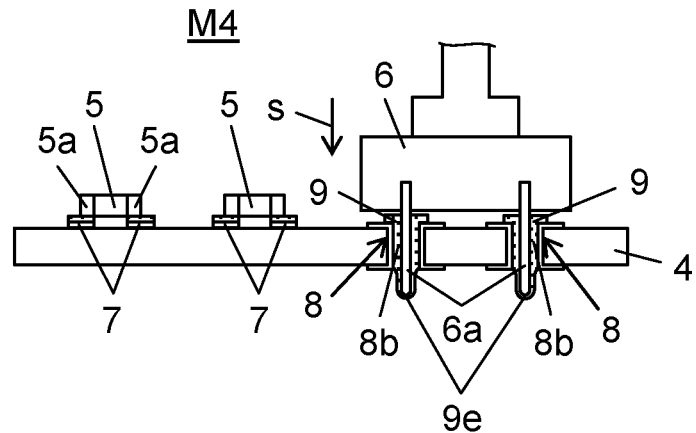
FIG. 8A is a process explanatory diagram showing a method for manufacturing the component-mounted board according to the embodiment of the present disclosure.

After tip adhesion paste 9d is integrated with solder paste 9 filled in inner hole 8b in this way, as shown in FIG. 8A, pin connection component 6 is lowered again (arrow s), and the tip portion of pin 6a is lowered to the mounting height position. At this time, pin 6a is lowered in a state in which the periphery thereof is wet with solder paste 9 filled in inner hole 8b. In this way, in a state in which the tip portion of pin 6a is lowered to the mounting height position, wet adhesion paste 9e wetting the outer peripheral surface of the portion protruding downward from inner hole 8b at pin 6a and solder paste 9 existing in inner hole 8b are in a continuous state in which the solder gets wet.

In order to improve the wet adhesion state of wet adhesion paste 9e on pin 6a, the pin vertical movement may be repeatedly executed a plurality of times. In this way, shear deformation due to the pin up and down acts on wet adhesion paste 9e a plurality of times to lower the viscosity of the wet adhesion paste 9e and obtain the effect of making it difficult for solder paste 9 to be separated. Furthermore, by the pin vertical movement, the effect that the adhesion of the flux ingredient of solder paste 9 to the surface of pin 6a is promoted is obtained. In this way, even in a case where solder paste 9 is separated, since the action of the melted solder at the time of reflowing being connected along pins 6a and wetting up is accelerated, it is possible to prevent a trouble that tip adhesion paste 9d adhering to pin 6a melts and falls or a trouble that tip adhesion paste 9d is solidified as it is.

Board 4 on which surface-mount component 5 and pin connection component 6 have been mounted in this way is sent to reflow device M5. Here, the reflow step is executed. In this reflow step, surface-mount component 5 and pin connection component 6 are mounted in the mounting step and board 4 on which the component mounting operation has been completed is heated and reflowed according to a predetermined heating profile. In this way, solder in solder paste 9 is melted and solidified, and surface-mount component 5 and pin connection component 6 are solder-bonded to board 4.

Figure 8B:
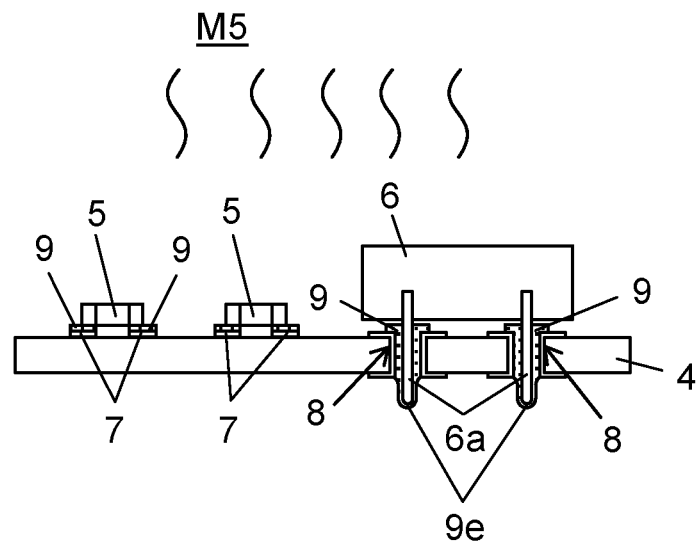
FIG. 8B is a process explanatory diagram showing a method for manufacturing the component-mounted board according to the embodiment of the present disclosure.
Figure 8C:
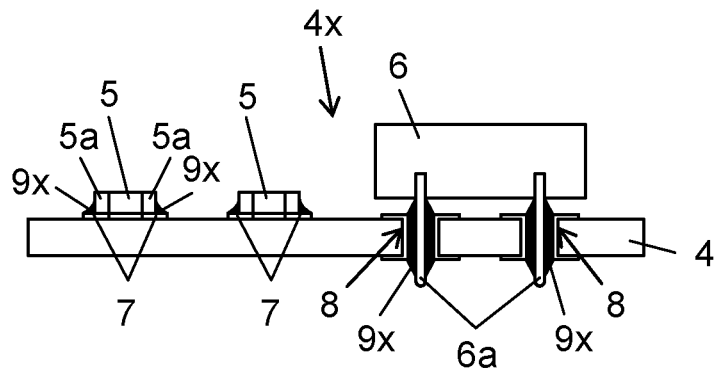
FIG. 8C is a process explanatory diagram showing a method for manufacturing the component-mounted board according to the embodiment of the present disclosure.

In this way, as shown in FIG. 8B, terminal 5a of surface-mount component 5 is solder-bonded to surface-mount electrode 7 via solder-bonded portion 9x in the form of a solder fillet. At the same time, pin 6a of pin connection component 6 is solder-bonded to through-hole electrode 8 via solder-bonded portion 9x formed to fill the inside of inner hole 8b of through-hole electrode 8 provided on board 4.

At this time, since wet adhesion paste 9e wetting the outer peripheral surface of the portion protruding downward from inner hole 8b at pin 6a and solder paste 9 existing in inner hole 8b are in a continuous state in which the solder gets wet, the solder ingredient of wet adhesion paste 9e wets up along pin 6a in the reflow step. In this way, the solder ingredients of wet adhesion paste 9e and solder paste 9 existing in inner hole 8b are integrated to form solder-bonded portion 9x filling the inside of inner hole 8b.

As described above, component-mounted board 4x in which surface-mount component 5 and pin connection component 6 which are electronic components are mounted on board 4 is completed and collected in board collecting device M6. In the above embodiment, the component mounting method has been described with reference to the mounting step shown in FIGS. 7A to 7D and 8A, but a range including a printing step executed prior to the mounting step and a reflow step executed after the mounting step may be defined as a target of the component mounting method.

As described above, in the screen printing method and the method for manufacturing a component-mounted board described in the present embodiment, in the screen printing of solder paste 9 on board 4 provided with through-hole electrode 8, board 4 is brought into contact with the lower surface of screen mask 13 provided with first pattern hole 14b corresponding to through-hole electrode 8. Furthermore, squeegee 17A is positioned above screen mask 13 with the predetermined gap therebetween and squeegee 17A is moved in a first direction to form a layer of solder paste 9 on the upper surface of through-hole electrode 8 via first pattern hole 14b. In addition, squeegee 17B is brought into contact with screen mask 13 and squeegee 17B is moved in the second direction which is different from the first direction to fill inner hole 8b of through-hole electrode 8 with solder paste 9 while pushing the layer of solder paste 9 so that solder paste 9 protrudes from the lower surface of board 4.

In this way, a sufficient amount of solder paste 9 may be supplied to through-hole electrode 8 by screen printing, and high bonding reliability may be secured in the solder bonding targeting through-hole electrode 8.

In addition, in the component mounting method and the method for manufacturing a component-mounted board described in the present embodiment, at the time of mounting pin connection component 6 provided with connecting pin 6a on board 4 provided with through-hole electrode 8, pin 6a of pin connection component 6 is inserted into inner hole 8b filled with solder paste 9 at through-hole electrode 8. Then, the component mounting operation of lowering pin 6a to the predetermined mounting height position is executed and the pin vertical movement is performed to pull up pin 6a once inserted and lowered into inner hole 8b in the component mounting operation to the preset intermediate height position so that tip adhesion paste 9d adhered to the tip portion of pin 6a and separated is brought into contact with solder paste 9 in inner hole 8b.

In this way, tip adhesion paste 9d separated by inserting pin 6a into inner hole 8b filled with solder paste 9 may be integrated with solder paste 9 in inner hole 8b, and it is possible to stably mount pin connection component 6 on board 4 having through-hole electrode 8 with high reliability.

The component mounting method and the method for manufacturing a component-mounted board of the present disclosure have an effect that it is possible to stably mount an electronic component on a board having a through-hole electrode with high reliability and is useful in the field of component mounting targeting a board having a through-hole electrode.

What is claimed is:

1. A component mounting method for mounting an electronic component provided with a connecting pin on a board having a through-hole, the method comprising:
    inserting the pin of the electronic component into an inner hole filled with solder paste at a first electrode provided in the through-hole;
    lowering the pin to a mounting height position for mounting the electronic component on the board;
    after lowering the pin to the mounting height position, pulling up the pin to an intermediate height position, the intermediate height position being higher than the mounting height position; and
    lowering the pin again to the mounting height position to improve an adhesion state of solder paste on the pin.

2. The component mounting method of claim 1, wherein:
    in lowering the pin, the pin is lowered until a tip portion of the pin reaches a position lower than a lower end portion of the inner hole; and
    in pulling up the pin, the pin is raised to a height at which the solder paste adhered to the tip portion of the pin comes into contact with the solder paste filled in the inner hole.

3. The component mounting method of claim 1, further comprising:
    executing a pin vertical movement for lowering and pulling up the pin at least once in a state where the pin is inserted into the inner hole.

4. A component mounting method for mounting an electronic component provided with a connecting pin on a board having a through-hole, the method comprising:
    a printing step of printing solder paste on the board;
    a mounting step of mounting the electronic component on the board on which the solder paste is printed; and
    a reflow step of melting and solidifying solder in the solder paste by heating the board on which the electronic component is mounted, to solder-bond the electronic component to the board,
    wherein, in the mounting step, the pin of the electronic component is inserted into an inner hole filled with solder paste at a first electrode provided in the through-hole and lowered to a mounting height position, and the pin once inserted and lowered into the inner hole in the component mounting operation is pulled up to a intermediate height position which is higher than the mounting height position, and then lowered again to the mounting height position to improve an adhesion state of solder paste on the pin, and
    in the reflow step, the pin is solder-bonded to the first electrode by reflowing the board on which the component mounting operation has been completed.

5. The component mounting method of claim 4,
    wherein, in the printing step, the board is brought into contact with a lower surface of a screen mask provided with a first pattern hole corresponding to the first electrode provided in the through-hole,
    the solder paste is supplied onto the screen mask,
    a squeegee is positioned above the screen mask at a predetermined gap and moving the squeegee in a first direction to form a layer of the solder paste on an upper surface of the first electrode via the first pattern hole, and the squeegee is brought into contact with the screen mask and moving the squeegee in a second direction different from the first direction and filling the inner hole of the first electrode with the solder paste while pushing the layer of the solder paste so that the solder paste protrudes from a lower surface of the board.

6. The component mounting method of claim 4,
wherein suction from the lower surface of the board is further performed while moving the squeegee in the first direction to form a layer of the solder paste on the upper surface of the first electrode.

7. The component mounting method of claim 4,
wherein an area of the first pattern hole is larger than an area of the inner hole of the first electrode.

8. The component mounting method of claim 4,
wherein a second electrode for a surface-mount component is provided on the surface of the board,
a second pattern hole corresponding to the second electrode is provided in the screen mask, and
when the squeegee moves in the second direction, the solder paste is printed on the second electrode via the second pattern hole.

9. A method for manufacturing a component-mounted board by mounting an electronic component provided with a connecting pin on a board having a through-hole, the method comprising:
inserting the pin of the electronic component into an inner hole filled with solder paste at a first electrode provided in the through-hole;
lowering the pin to a mounting height position;
pulling up the pin once inserted and lowered into the inner hole in the component mounting operation to an intermediate height position, the intermediate height position being higher than the mounting height position; and
lowering the pin again to improve a wet adhesion state of solder paste on the pin.

10. The method for manufacturing a component-mounted board of claim 9, wherein:
lowering the pin to the mounting height position includes lowering the pin until the tip portion of the pin reaches a position lower than the lower end portion of the inner hole; and
pulling up the pin to the intermediate height position includes pulling up the pin to a height at which the solder paste adhered to the tip portion of the pin comes into contact with the solder paste filled in the inner hole.

11. The method for manufacturing a component-mounted board of claim 9, further comprising:
executing a pin vertical movement for lowering and pulling up the pin at least once in a state where the pin is inserted into the inner hole.

12. A method for manufacturing a component-mounted board by mounting an electronic component provided with a connecting pin on a board having a through-hole, the method comprising:

a printing step of printing solder paste on the board;
a mounting step of mounting the electronic component on the board on which the solder paste is printed; and
a reflow step of melting and solidifying the solder in the solder paste by heating the board on which the electronic component is mounted, to solder-bond the electronic component to the board,
wherein, in the mounting step, the pin of the electronic component is inserted into an inner hole filled with solder paste at a first electrode provided in the through-hole and lowered to a mounting height position, and the pin once inserted and lowered into the inner hole in the component mounting operation is pulled up to an intermediate height position, the intermediate height position being higher than the mounting height position, and then lowered again to improve a wet adhesion state of solder paste on the pin, and
in the reflow step, the pin is solder-bonded to the first electrode by reflowing the board on which the component mounting operation has been completed.

13. The method for manufacturing a component-mounted board of claim 12,
wherein, in the printing step, the board is brought into contact with a lower surface of a screen mask provided with a first pattern hole corresponding to a first electrode provided in the through-hole,
the solder paste is supplied onto the screen mask,
the squeegee is positioned above the screen mask at a predetermined gap and moving the squeegee in a first direction to form a layer of the solder paste on an upper surface of the first electrode via the first pattern hole, and
the squeegee is brought into contact with the screen mask and moving the squeegee in a second direction different from the first direction to fill the inner hole of the first electrode with the solder paste while pushing the layer of the solder paste so that the solder paste protrudes from the lower surface of the board.

14. The method for manufacturing a component-mounted board of claim 12,
wherein suction from the lower surface of the board is further performed while moving the squeegee in the first direction to form a layer of the solder paste on the upper surface of the first electrode.

15. The method for manufacturing a component-mounted board of claim 12,
wherein an area of the first pattern hole is larger than an area of the inner hole of the first electrode.

16. The method for manufacturing a component-mounted board of claim 12,
wherein a second electrode for a surface-mount component is provided on the surface of the board,
a second pattern hole corresponding to the second electrode is provided in the screen mask, and
when the squeegee moves in the second direction, the solder paste is printed on the second electrode via the second pattern hole.

* * * * *